US010707550B2

(12) United States Patent
Milroy et al.

(10) Patent No.: US 10,707,550 B2
(45) Date of Patent: Jul. 7, 2020

(54) HIGH-Q DISPERSION-COMPENSATED PARALLEL-PLATE DIPLEXER

(71) Applicant: ThinKom Solutions, Inc, Hawthorne, CA (US)

(72) Inventors: William Milroy, Torrance, CA (US); Alan Lemons, San Pedro, CA (US)

(73) Assignee: ThinKom Solutions, Inc., Hawthorne, CA (US)

( * ) Notice: Subject to any disclaimer, the term of this patent is extended or adjusted under 35 U.S.C. 154(b) by 42 days.

(21) Appl. No.: 16/114,586

(22) Filed: Aug. 28, 2018

(65) Prior Publication Data

US 2020/0076043 A1   Mar. 5, 2020

(51) Int. Cl.
| | | |
|---|---|---|
| H01P 1/02 | (2006.01) |
| H01P 5/18 | (2006.01) |
| H01P 1/213 | (2006.01) |
| H01P 3/12 | (2006.01) |
| H01Q 19/13 | (2006.01) |
| H03H 11/34 | (2006.01) |

(52) U.S. Cl.
CPC .............. *H01P 5/182* (2013.01); *H01P 1/025* (2013.01); *H01P 1/2138* (2013.01); *H01Q 19/138* (2013.01); *H03H 11/34* (2013.01)

(58) Field of Classification Search
CPC .. H01P 1/161; H01P 1/213; H01P 5/12; H01P 3/12; H03H 7/46
USPC .................................. 333/113, 126, 132, 137
See application file for complete search history.

(56) References Cited

U.S. PATENT DOCUMENTS

| | | | | |
|---|---|---|---|---|
| 4,812,789 A | * | 3/1989 | Lee .......................... | H01P 1/182 333/135 |
| 7,019,706 B2 | * | 3/2006 | Yoneda ................. | H01P 1/2131 333/135 |
| 7,256,667 B1 | * | 8/2007 | Forman .................. | G02B 6/102 333/137 |

(Continued)

FOREIGN PATENT DOCUMENTS

| | | | |
|---|---|---|---|
| GB | 2359197 A | * | 8/2001 |
| WO | WO 2018120737 A1 | | 7/2018 |

OTHER PUBLICATIONS

Goussetis et al., E-Plane Double Ridge Waveguide Filters and Diplexers for Communication Systems, 2001, 31st European Microwave Conference, 5 pages.*

(Continued)

*Primary Examiner* — Dean O Takaoka
(74) *Attorney, Agent, or Firm* — Kusner & Jaffe (57) ABSTRACT

A parallel-plate diplexer includes a first parallel-plate transmission line and a second parallel-plate transmission line, a first end of the second parallel-plate transmission line including a first port and a second end of the second parallel-plate transmission line including a second port, and a first end of the first parallel-plate transmission line including a third port and a second end of the first parallel-plate transmission line being coupled to the second parallel-plate transmission line at a T-junction between the first port and the second port. The second parallel-plate transmission line includes a first parallel-plate transmission line tuning network located between the T-junction and the first port, and a second parallel-plate transmission line tuning network located between the T-junction and the second port.

14 Claims, 9 Drawing Sheets

(56) References Cited

U.S. PATENT DOCUMENTS

| | | | |
|---|---|---|---|
| 7,332,982 B2 | 2/2008 | Yun et al. | |
| 7,821,355 B2 * | 10/2010 | Engel | H01P 1/211 333/117 |
| 2006/0202899 A1 | 9/2006 | Milroy et al. | |
| 2007/0139135 A1 * | 6/2007 | Ammar | H01P 1/2138 333/135 |
| 2008/0245560 A1 | 10/2008 | Crouch et al. | |
| 2015/0123862 A1 | 5/2015 | Milroy et al. | |
| 2016/0156373 A1 * | 6/2016 | Zhai | H04B 1/0057 370/297 |

OTHER PUBLICATIONS

Vosoogh et al., E-Band 3-D Metal Printed Wideband Planar Horn Array Antenna, 2016, IEICE, POS1-10, 2 pages.*
Vosoogh et al., An Integrated Ka-Band Diplexer-Antenna Array Module Based on Gap Waveguide Technology With Simple Mechanical Assembly and No Electrical Contact Requirements, Feb. 2018, IEEE, vol. 66 No. 2, 11 pages.*
Teberio et al., Compact Broadband Waveguide Diplexer for Satellite Applications, 2016, IEEE, 4 pages.*
Yao et al., Wide-Band Waveguide and Ridge Waveguide T-Junctions for Diplexer Applications, Dec. 1993, IEEE, vol. 41 No. 12, 8 pages.*
Rezaee et al., V-Band Groove Gap Waveguide Diplexer, May 2015, EuCAP, 4 pages.*
European Search Report, dated Jan. 24, 2020, from corresponding European Patent Application No. 19193388.6.
K.H.Park et al., An analytic series solution for E-plane T-junction in parallel-plate waveguide, IEEE Transactions on Microwave Theory and Techniques, dated Feb. 1, 1994, pp. 356-358; vol. 42; issue 2.

* cited by examiner

HIGH-Q DISPERSION-COMPENSATED PARALLEL-PLATE DIPLEXER

TECHNICAL FIELD

The present invention relates generally to broad band separation of distinct and widely separated frequency bands propagating through a parallel-plate transmission line (also referred to herein simply as 'parallel-plate'). More specifically, the invention relates to a parallel-plate diplexer for performing such separation.

BACKGROUND ART

Dual band planar (and other types of) antenna systems often require the antenna to fit into ever-shrinking available spaces while maintaining key performance characteristics, such as high ohmic efficiency and dual-band operation in which two separate operating bands must be diplexed (separated) from one another. To achieve the desired performance, a hybrid combination of parallel-plate and waveguide transmission lines are often used as propagation media in the antenna design due to their superior bandwidth and ohmic efficiency characteristics. The waveguide transmission line (also referred to herein simply as 'waveguide') section is usually deployed in a corporate feed, traveling-wave feed, standing-wave feed, or other structure where multiple outputs are coupled to a common parallel-plate section. To support the hybrid combination of transmission lines and to support efficient performance over two widely separated frequency bands, there exists a coupling transition between the two-different media and diplexing (separation) of the two frequency bands.

Conventionally, substantial packaging volume is required to fit the numerous transmission lines and components necessary to draw-out two widely separated frequency bands from a broadband structure, such as a parallel-plate. Prior approaches propagate both bands through the parallel-plate, waveguide, and then coaxial medium before effecting the necessary frequency separation via a separately attached diplexing device.

Typical methods for drawing-out two widely separated frequency bands from a broadband structure such as a parallel-plate involves first transitioning to an array of relatively broadband, closely-spaced, ridged waveguide or coaxial transmission lines combined via a corporate feed network that results in a single waveguide or coaxial output, or alternatively, using a tapered horn to effect this transition (from parallel plate to a single output). Both approaches would use a separately attached waveguide or coaxial diplexer coupled to the single output to separate the two bands of interest. Each approach has its drawbacks either in terms of reduced efficiency, reduced bandwidth, reduced isolation, reduced frequency selectivity, added height profile, added design complexity or added manufacturing complexity.

For example, a common practice for transitioning high radio frequency (RF) power between a waveguide and a parallel-plate, when the waveguide is located in the same plane (level) as the parallel-plate structure and still required to carry a relatively wide band or two widely separated frequency bands, is through a ridged waveguide transition or a tapered horn transition. While the approaches are thin in height profile, in a practical case where multiple ridged waveguides or a tapered horn are used to feed a large parallel-plate region, feeding such a structure may be a challenge in the available space (which is usually confined to the total area provided by the product). Further, even with the extended bandwith afforded by the ridged-waveguide transmission-line structure, it is typically impractical to achieve lower-upper bandwidth separations of 2:1 or more, whereas the parallel-plate structure in accordance with the invention can support bandwidth separations up to 5:1.

Additionally, once the parallel-plate structure has been transitioned to a single waveguide or coaxial output, the output still carries two disparate frequency bands that must be separated from one another. This necessitates the use of additional diplexing hardware/components to effect such separation, further exacerbating the packaging and manufacturing challenges associated with such architecture.

In view of the aforementioned shortcomings, there is a need for a parallel-plate diplexer suitable for providing broad band separation of distinct and widely separated frequency bands propagating through parallel-plate transmission line.

SUMMARY

The parallel-plate diplexer in accordance with the invention includes a first parallel-plate and a second parallel-plate, where the first parallel-plate intersects the second parallel-plate to define a junction. Tuning networks are formed in the second parallel-plate on each sides of the junction to enable/inhibit signals having a predetermined frequency range. RF signals entering the first parallel-plate travel to the second parallel-plate and are split into two different frequency bands, the frequency bands corresponding to the tuning networks. The parallel-plate diplexer in accordance with the invention mitigates the packaging and manufacturing limitations of traditional coupling transitions and components while providing improved bandwidth and efficiency.

According to one aspect of the invention, a parallel-plate diplexer includes: a first parallel-plate transmission line; and a second parallel-plate transmission line, wherein a first end of the second parallel-plate transmission line includes a first port and a second end of the second parallel-plate transmission line includes a second port. A first end of the first parallel-plate transmission line includes a third port and a second end of the first parallel-plate transmission line is coupled to the second parallel-plate transmission line at a T-junction between the first port and the second port, wherein the second parallel-plate transmission line includes a first parallel-plate transmission line tuning network located between the T-junction and the first port, and a second parallel-plate transmission line tuning network located between the T-junction and the second port.

In one embodiment, the first parallel-plate transmission line tuning network is configured in order that the second parallel-plate transmission line between the first port and the T-junction passes radio-frequency (RF) energy in a low-band and rejects RF energy in a high-band which is separate from and higher than the low-band, the second parallel-plate transmission line tuning network is configured in order that the second parallel-plate transmission line between the second port and the T-junction passes the RF energy in the high-band and rejects the RF energy in the low-band, and the first parallel-plate transmission line is configured in order to pass RF energy in both the low-band and the high-band.

In one embodiment, at least one of the first parallel-plate transmission line tuning network or the second parallel-plate transmission line tuning network includes one or more parallel-plate tuner grooves or resonators.

In one embodiment, each resonator includes at least two corresponding tuner grooves.

In one embodiment, the first parallel-plate transmission line tuning network is configured to form substantially a short circuit with respect to the RF energy in the high-band, and the second parallel-plate transmission line turning network is configured to form substantially a short circuit with respect to the RF energy in the low-band.

In one embodiment, the high-band and low-band have a bandwidth separation of at least 2:1.

In one embodiment, the low-band and high-band incorporate 20.7 Gigahertz (GHz) and 44.5 GHz, respectively.

In one embodiment, the tuning network is arranged on a surface of the second parallel-plate that is immediately adjacent a junction joining the first parallel-plate to the second parallel-plate.

In one embodiment, the tuning network is arranged on a surface of the second parallel-plate that is opposite a junction joining the first parallel-plate to the second parallel-plate.

In one embodiment, a height of the parallel-plate portion between the T-junction and the first port is different from a height of the parallel-plate portion between the T-junction and the second port.

In one embodiment, dimensions of the first parallel-plate transmission line and the second parallel-plate transmission line are configured to favor transmission of lower-order modes over higher-order modes.

In one embodiment, at least one of the first, second and third ports include a respective parallel plate-to-waveguide transition coupled thereto.

In one embodiment, at least one of the respective parallel plate-to-waveguide transitions couples to a corporate waveguide feed.

In one embodiment, at least one of the respective parallel plate-to-waveguide transitions couples to a tapered horn feed.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features.

DETAILED DESCRIPTION

Described herein is a parallel-plate diplexer with high-Q dispersion-compensation. The parallel-plate diplexer is particularly suited for separating (splitting) two frequency bands contained in a single parallel plate transmission line into two separate parallel-plate sections prior to transitioning to some other media such as waveguide or coaxial medium. This eliminates the need to carry both frequency bands in a single, more-complicated feed and then separating the bands from one another via additional diplexing hardware. In contrast to conventional approaches, the parallel-plate diplexer described herein has significant advantages in the areas of packaging (more compact), performance (frequency selectivity and loss), cost (simplified fabrication), and bandwidth (supports wider lower-upper band separation), with reduced dispersion (superior performance in the presence of multiple modes.)

The parallel-plate diplexer in accordance with the invention offers a means of separating two frequency bands using parallel plate as the diplexing media (e.g., performing the diplexing function solely using parallel plates, without separate diplexing hardware). Further, by employing a "High-Q" (low dissipative loss) parallel-plate transmission-line media (in lieu of conventional waveguide, stripline, microstrip, etc. transmission lines), superior pass-band and stop-band performance (in terms of reduced insertion loss and sharper frequency band selectivity) are achieved. Through selective control of parallel-plate transmission-line modes (favoring lower modes over higher modes), traditional dispersion limitations associated with finite-width parallel-plate structures may be avoided.

Parallel-plate transmission lines are conventionally known. As used herein, a parallel-plate transmission line is defined as typically being made up of two parallel conducting plates (e.g., brass, copper, silver, aluminum) of width w separated in height h by a dielectric material $\varepsilon$ (e.g., air, dielectric substrate), with the width w of the plates being much larger than the separation height h (w>>h) in order that fringing effects in the width direction are minimal and may be generally neglected. Distinct from conventional waveguide which is generally a single-mode transmission line, parallel plate employs multiple modes, serving to significantly extend the frequency bandwidth of the structure, while favorably reducing dissipative/ohmic losses.

Figure 1:
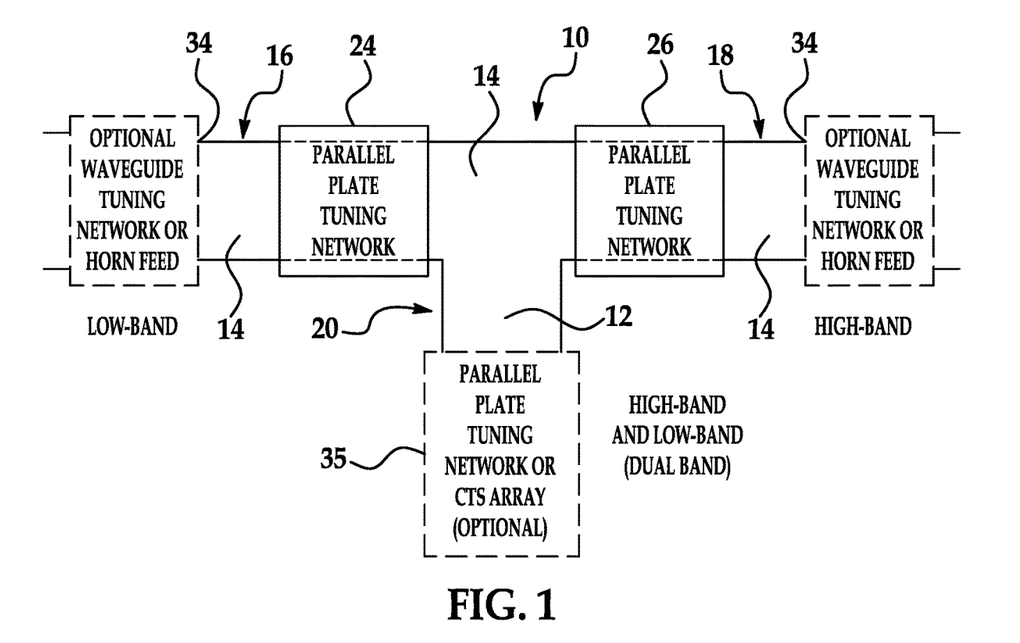
FIG. 1 is a block diagram of an exemplary parallel-plate diplexer in accordance with the present invention.

Referring initially to FIG. 1, illustrated is a simple block diagram showing components of an exemplary parallel-plate diplexer 10 in accordance with the invention. As will be described in further detail below, the diplexer 10 includes a first parallel-plate transmission line 12, a second parallel-plate transmission line 14, and three ports 16, 18, 20 defined by the parallel-plates 12 and 14. More specifically, the ports 16 and 18 are formed at respective ends of the second parallel-plate 14, and the port 20 is formed in one end of the first parallel-plate 12.

The diplexer 10 also includes single frequency band parallel-plate tuning networks 24 and 26 in portions of the second parallel-plate 14. As will be discussed below, the tuning networks 24 and 26 serve to pass energy in one band while attenuating energy in another band (e.g., the first tuning network 24 may allow low-frequency signals to pass while attenuating high-frequency signals, and the second tuning network 26 may reject low-frequency signals and allow high-frequency signals to pass). A waveguide to parallel-plate transition 34 or other transmission medium can be coupled to each port 16 and 18 to facilitate communication of the diplexed signals to/from the diplexer 10.

While the diplexer 10 has been described above in a reception mode of operation whereby the received signal would be "split" into two separate receive bands, the diplexer 10 is a reciprocal device that can both transmit and receive RF signals. For example, an RF signal to be transmitted may be received by the third port 20, and travel within the first parallel-plate 12 to the second parallel-plate 14. The RF signal is then split into the respective frequency bands within the second parallel-plate 14 by the tuning networks 24 and 26, and the respective frequency bands travel in respective portions of the second parallel-plate 14 and are each received via the ports 16 and 18. The reverse is also possible, where signals of two different frequency bands are transmitted at the ports 16 and 18 and travel within the second parallel-plate 14. The signals are combined and provided to the first parallel-plate 12 and output by the third port 20, which can operate as a single radiating element (parallel plate line source) or act as an input to a full CTS or VICTS antenna array of radiating elements. Alternatively, one port 16 may act as a receive port while port 18 acts as a transmit port with port 20 acting simultaneously as a receive port supporting port 16 and as a transmit port supporting port 18. Thus, depending on the mode of operation, the ports 16 and 18 can operate as an input port or output port, and port 20 can operate as both.

Figure 2:
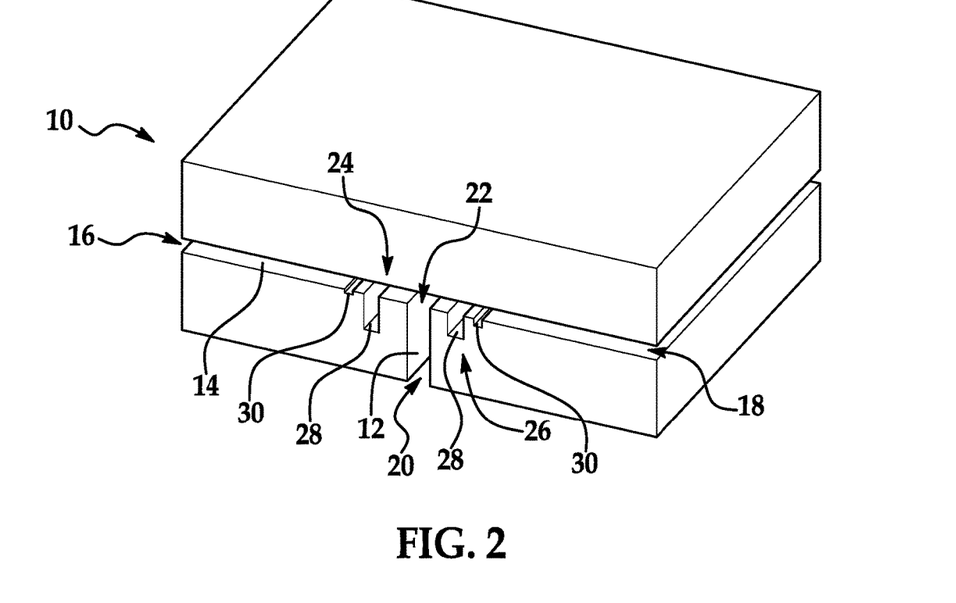
FIG. 2 is an isometric view of a parallel-plate diplexer according to an embodiment in accordance with the present invention.
Figure 3:
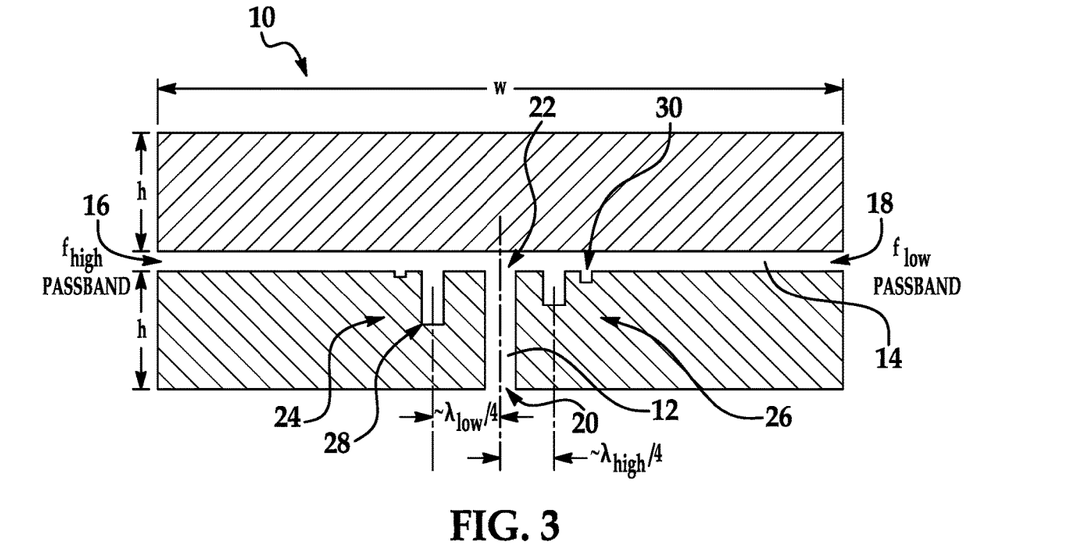
FIG. 3 is a cross-sectional view of the parallel-plate diplexer shown in FIG. 2.

With additional reference to FIGS. 2 and 3, shown is an exemplary embodiment of a parallel-plate diplexer 10 in accordance with the present invention. The parallel-plate diplexer 10 includes a first parallel-plate transmission line 12 and a second parallel-plate transmission line 14. The first parallel-plate transmission line 12 represents a common arm (also referred to as a main arm) of the diplexer 10, and the second parallel-plate transmission line 14 represents a pair of colinear arms (also referred to as side arms) of the diplexer 10, the colinear arms being coplanar with each other. A first end of the second parallel-plate transmission line 14 includes a first port 16 and a second end of the second parallel-plate transmission line 14 includes a second port 18. A first end of the first parallel-plate transmission line 12 includes a third port 20, and a second end of the first parallel-plate transmission line 12 is coupled to the second parallel-plate transmission line 14 at a T-junction 22 between the first port 16 and the second port 18. In the exemplary embodiment, the T-junction 22 is an E-plane T-junction between the first parallel-plate transmission line 12 and the second parallel-plate transmission line 14 (i.e., the axis of the second parallel-plate transmission line 14 is parallel to the E-field of the first parallel-plate transmission line 12). The first and second parallel-plate transmission lines 12 and 14 each are made up of two parallel conducting plates having a width w and separated in height h by a dielectric material $\varepsilon$, in this example air. As previously noted, w>>h so that fringe effects in the width w direction can be generally ignored. In the exemplary embodiment the width w, height h and dielectric material $\varepsilon$ are the same for both the first and second parallel-plate transmission lines 12 and 14. However, different dimensions and/or dielectric material may be selected for the different transmission lines if desired. In the case of different dimensions, a tapered section (not shown) between the first and second parallel-plate transmission lines 12 and 14 may be utilized.

The particular dimensions w, h and dielectric material $\varepsilon$ are selected according to conventional parallel-plate transmission line design in order to accommodate the particular operating frequencies of interest. The dimensions w, h of the first parallel-plate transmission line 12 and the second parallel-plate transmission line 14 are configured to favor transmission of lower-order modes over higher-order modes. As a result, traditional dispersion limitations associated with parallel-plate structures can be avoided.

The second parallel-plate transmission line 14 includes a first parallel-plate transmission line tuning network 24 located between the T-junction 22 and the first port 16. In addition, the second parallel-plate transmission line 14 includes a second parallel-plate transmission line tuning network 26 located between the T-junction 22 and the second port 18.

The first parallel-plate transmission line tuning network 24 is configured such that the second parallel-plate transmission line 14 between the first port 16 and the T-junction 22 passes radio-frequency (RF) energy in a first band (e.g., a low-band) and rejects RF energy in a second band (e.g., a high-band) which is separate from and higher than the low-band. Conversely, the second parallel-plate transmission line turning network 26 is configured such that the second parallel-plate transmission line 14 between the second port 18 and the T-junction 22 passes the RF energy in the second band and rejects the RF energy in the first band. The first parallel-plate transmission line 12 is configured to pass RF energy in both the first and second bands. As such, in the present example the first port 16 represents the low-band port of the diplexer 10 and the second port 18 represents the high-band port. The third port 20, in turn, represents the dual-band port of the parallel-plate diplexer 10.

In the exemplary embodiment, the first parallel-plate transmission line tuning network 24 and second parallel-plate transmission line tuning network 26 are each made up of one or more parallel-plate resonators and/or tuner grooves. As is shown in FIGS. 2 and 3, the parallel-plate tuning networks 24 and 26 each include a plurality of resonators and/or tuner grooves configured to effect the diplexing function and necessary frequency isolation between ports with respect to the high- and low-bands as described above.

The resonator between the T-junction 22 and the first port 16 reflects at $f_{low}$, where the depth of the resonator is approximately $\lambda_{low}/4$, while the tuner groove between the T-junction 22 and the first port 16 tunes VSWR in $f_{high}$ Passband, where the depth of the tuner groove is much less than $\lambda_{high}/4$. Conversely, the resonator between the T-junction 22 and the second port 18 reflects at $f_{high}$, where the depth of the resonator is approximately $\lambda_{high}/4$, while the tuner groove between the T-junction 22 and the second port 18 tunes VSWR in $f_{low}$ Passband, where the depth of the tuner groove is much less than $\lambda_{low}/4$.

The selection and arrangement of resonators and/or tuner grooves in each of the first and second parallel-plate transmission line tuning networks 24 and 26 may be in accordance with known parallel-plate design techniques. Functionally, the parallel-plate diplexer 10 is intended to (i) in the desired low frequency band (low-band), behave as a matched low-loss 2-port device connecting the common input/output third port 20 to the low-band first port 16, while isolating the high-band second port 18; and (ii) in the desired high frequency band (high-band), behave as a matched low-loss 2-port device connecting the common input/output third port 20 to the high-band port second port 18, while isolating the low-band first port 16. The first parallel-plate transmission line tuning network 24 is thus configured to form substantially a short circuit with respect to the RF energy in the high-band while passing RF energy in the low-band. The second parallel-plate transmission line turning network 26 is configured to form substantially a short circuit with respect to the RF energy in the low-band while passing RF energy in the high-band.

In the exemplary embodiment, the parallel-plate diplexer 10 is designed for a bandwidth separation of 2:1 between the low-band and the high-band (20 Gigahertz (GHz) and 44 GHz, respectively). Even higher bandwidth separation, such as 5:1, is possible based on the principles described herein as will be appreciated.

The tuning networks 24 and 26 may each include at least one resonator 28 (¼ wave stub), which is intended to provide a very high reflection coefficient (ideally 100% reflection) at the desired frequency of the port on the opposing side of the T-junction from the resonator. In this regard, the depth and/or width of the resonator 28 between the T-junction 22 and the first port 16 may be different from a depth and/or width of the resonator 28 between the T-junction 22 and the second port 18. The resonator 28 is typically located approximately ¼ wavelength from the centerline (CL) of the T-junction 22 and is approximately ¼ wavelength deep (at its resonant frequency.) The resonator 28 has the effect of making the 3-port diplexer 10 behave like a 2-port E-bend with a minimum of leakage into the 3rd port, and the ¼ offset from the common junction has the favorable effect of providing a "good" match (low |S11|—S11 being the reflection coefficient of the diplexer) in the desired pass-band.

In some cases, it may be desirable to employ multiple resonators 28 on each side of the T-junction 22 in order to better "broadband" the diplexer characteristics, particularly, the stop-band(s). These multiple resonators 28 are typically quite similar in depth to each other with the intent of resonating at slightly different frequencies and are typically separated by approximately ¼ wavelength (in the stop-band) such that their reflections constructively add to reinforce the reflection and isolation in the stop-band. The widths of the resonators 28 are generally kept at well below lambda/8 (lambda being the free-space wavelength of the medium itself, which is typically air) in width such that (undesirable) higher-order modes in the stub region are minimized (i.e., are well below their cut-off frequencies and therefore are exponentially suppressed).

The multiple resonators 28 may be employed on both the upper and lower parallel-plate surfaces. Further, while the typical shape of the resonators 28 is rectangular (with sharp edges), variants including finite or even full-radii (for the purpose of improved manufacturing) do not diminish the desired performance of the diplexer function.

In addition to the resonators 28, tuner grooves 30, which are typically much shallower in depth than ¼ wave, can be employed in order to better match (minimize |S11|) in the passband. As previously mentioned, the offset of the stop-band resonators 28 is typically ¼ (or multiples of quarter wave when multiple resonators are employed). This serves to "coarsely" match the junction in the pass-band but leaves a "residual" reflection that the tuners 30 serve to cancel (reduce the |S11| passband magnitude further). The depth of the tuner groove 30 is selected such that the magnitude of its reflection coefficient is similar/identical to the magnitude of the "residual" (i.e., the signal remaining if the tuners were not present) and a position of the tuner groove 30 along the parallel-plate transmission line 14 is adjusted such that it's added reflection serves to cancel the residual reflection of the "resonator only" junction. Like the resonators 28, the depth and/or with of the tuner groove 30 between the T-junction 22 and the first port 16 may be different from a depth and/or width of the tuner groove 30 between the T-junction 22 and the second port 18.

Similar to the case of the resonators 28, multiple tuner grooves 30 may be employed in order to provide a more complex reflection characteristic to better match the residual characteristic of the resonator-only junction. Also, widths are generally restricted to below lambda/8 and a non-rectangular cross-section shape may be employed as well. Tuner grooves 30 may also be added to the T-junction 22 in order to "fine-tune" the match of one or both pass-bands.

The parallel-plate height h of the second parallel-plate 14 (the collinear arms) is preferably kept below ½ wavelength (defined at the highest frequencies) such that undesired higher-order modes (which would degrade both passband and stopband performance) are suppressed.

FIGS. 4-9 show alternative embodiments of a parallel-plate diplexer in accordance with the invention. For sake of brevity, only differences between the first embodiment (FIGS. 2 and 3) and the other embodiments (FIGS. 4-9) are discussed below.

Figure 4:
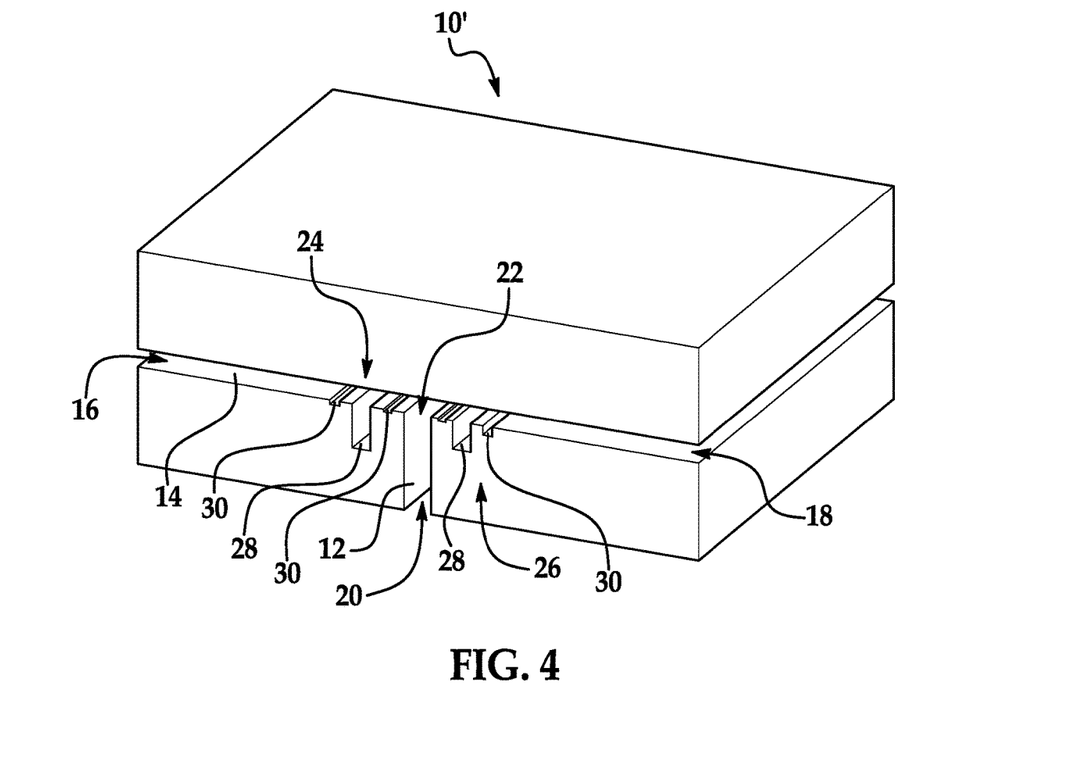
FIG. 4 is an isometric view of a parallel-plate diplexer according to another embodiment in accordance with the present invention.
Figure 5:
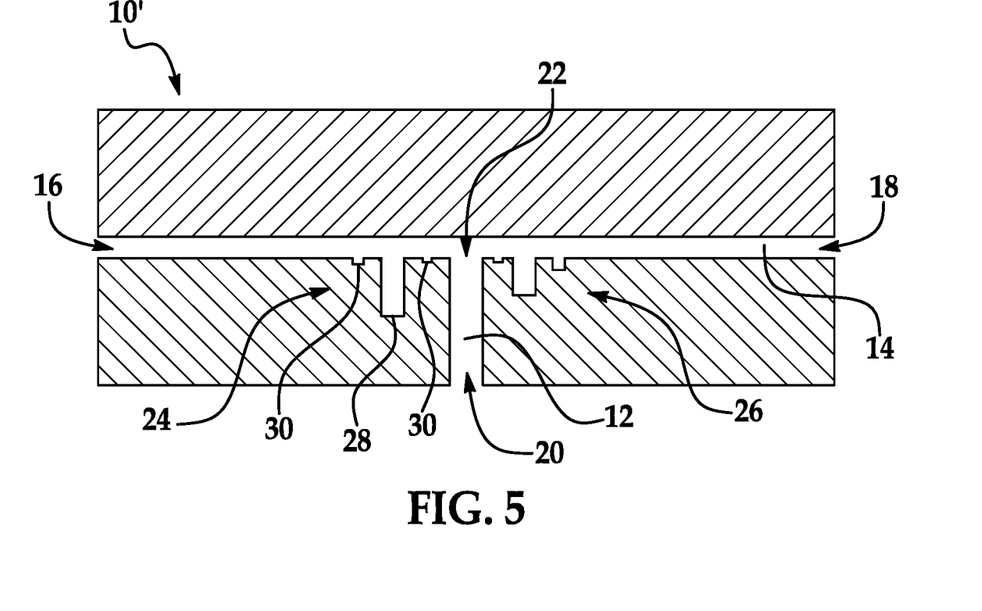
FIG. 5 is a cross-sectional view of the parallel-plate diplexer shown in FIG. 4.

FIGS. 4 and 5 illustrate a second embodiment of a parallel-plate diplexer 10' in accordance with the invention. The diplexer 10' includes two tuner grooves 30 per resonator 28. The additional tuner grooves 30 may be used to further fine-tune the frequency characteristics of the arms of the second parallel-plate 14 offering better overall efficiency of the design through reduced reflections.

Figure 6:
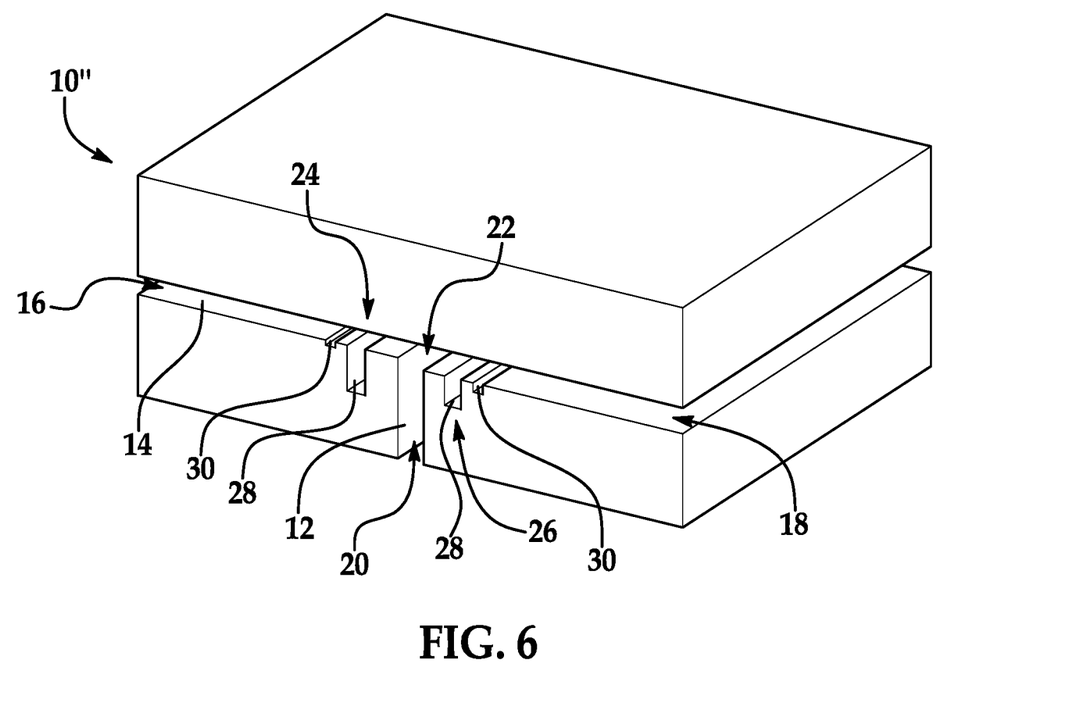
FIG. 6 is an isometric view of a parallel-plate diplexer according to another embodiment in accordance with the present invention.
Figure 7:
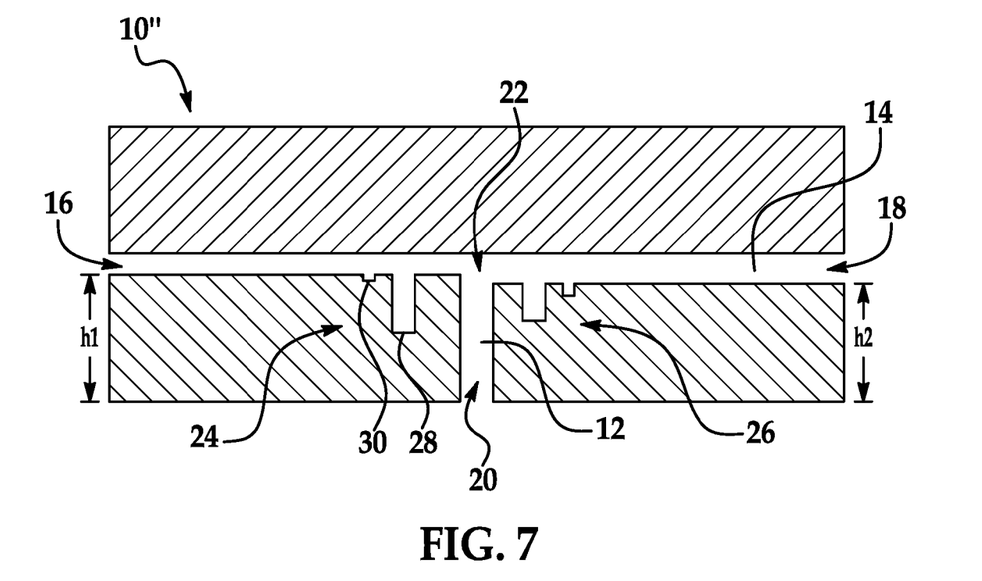
FIG. 7 is a cross-sectional view of the parallel-plate diplexer shown in FIG. 6.

FIGS. 6 and 7 illustrate a third embodiment of a diplexer 10" in accordance with the invention. The diplexer 10" has non-equal h dimension, where a height of the parallel-plate section between the T-junction 22 and the first port 16 is greater than a height of the parallel-plate portion between the T-junction 22 and the second port 18.

Figure 8:
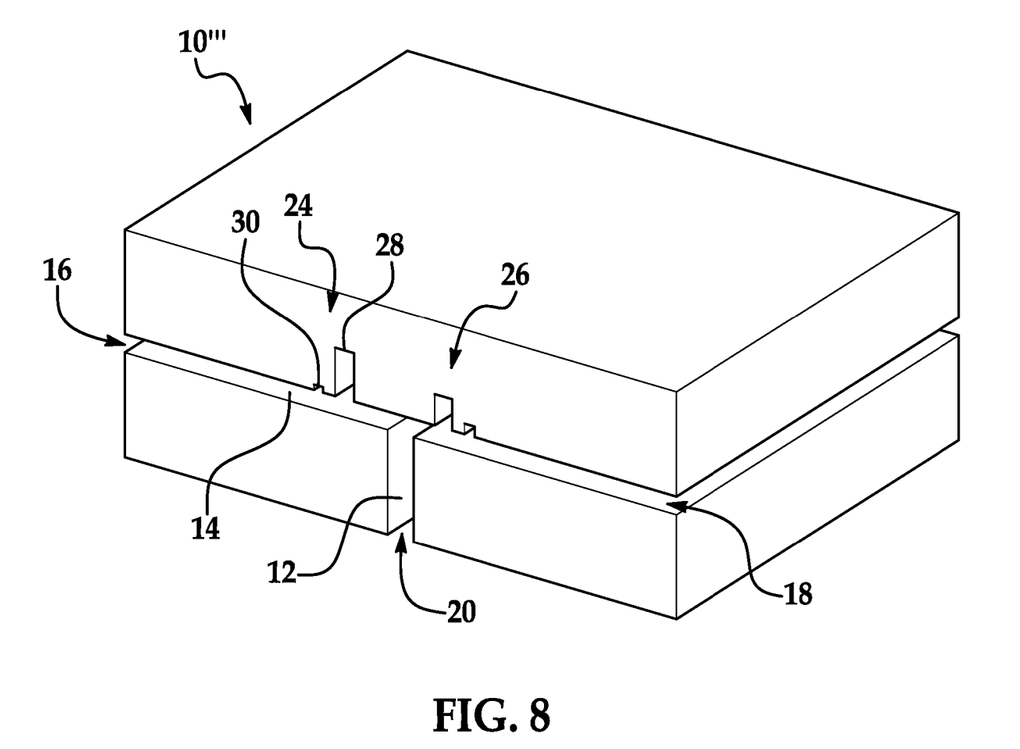
FIG. 8 is an isometric view of a parallel-plate diplexer according to another embodiment in accordance with the present invention.
Figure 9:
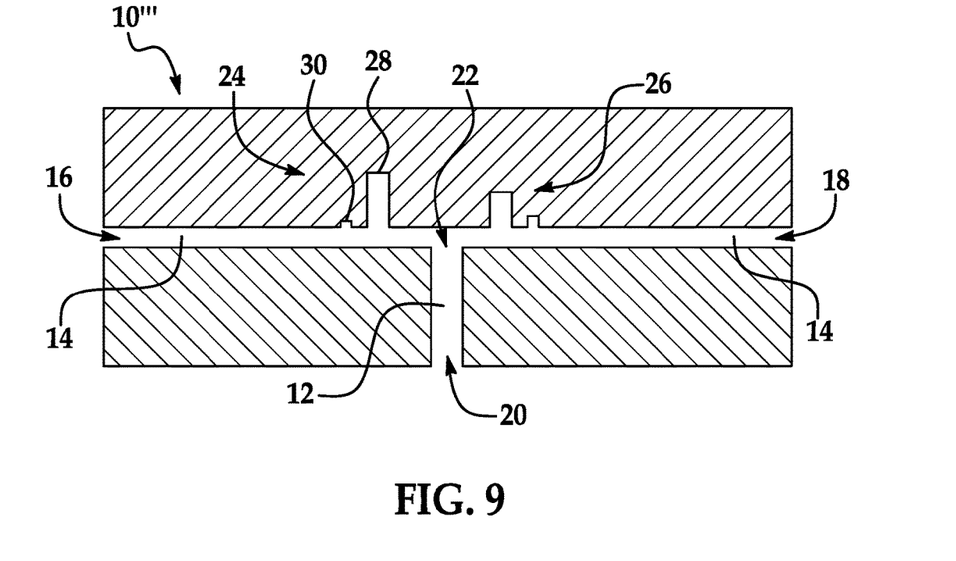
FIG. 9 is a cross-sectional view of the parallel-plate diplexer shown in FIG. 8.

FIGS. 8 and 9 illustrate a fourth embodiment of a diplexer 10 in accordance with the invention. The diplexer 10 is similar to the diplexer 10 of FIGS. 2 and 3, except that the resonators 28 and tuner grooves 30 are formed in an upper portion of the second parallel-plate 14, potentially allowing for simplified construction of the part(s) employed to form the port 20 portion of the diplexer.

Figure 10:
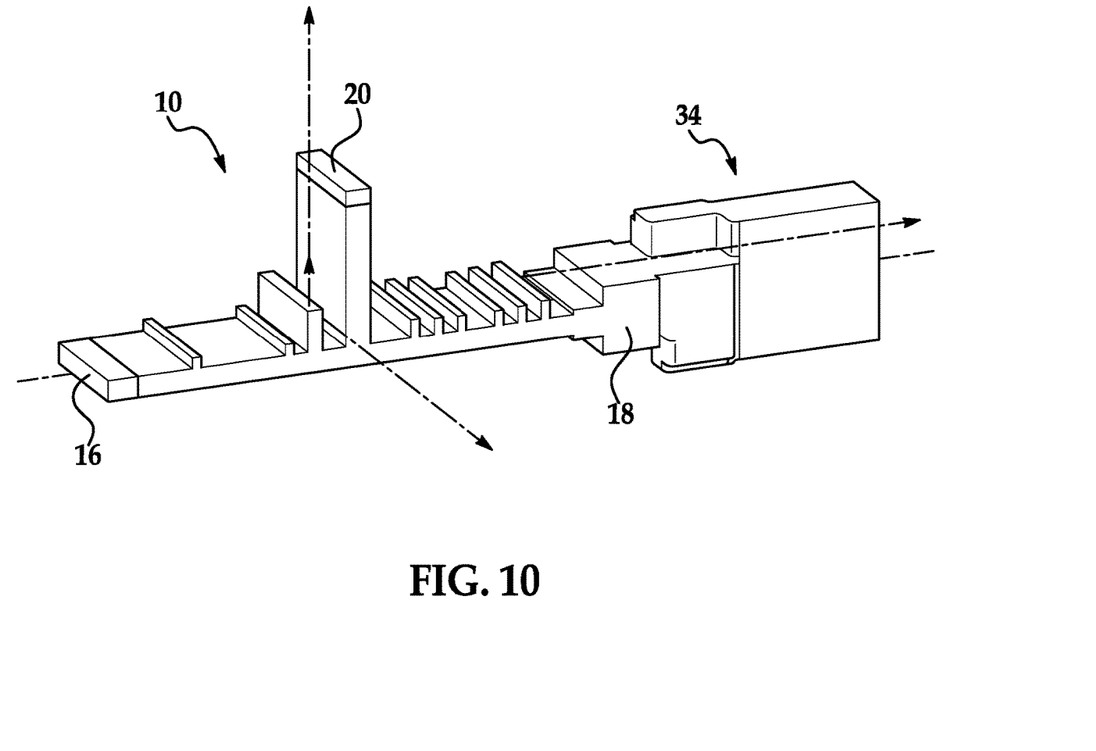
FIG. 10 is an isometric view of a parallel-plate diplexer according to another embodiment in accordance with the present invention, further including an exemplary parallel-plate to waveguide transition at an output port.

Various parallel-plate-to-other type transmission line media (e.g., waveguide, stripline, microstrip, etc.) may be combined as desired to the parallel-plate diplexer 10 at one or more of the ports 16, 18, 20. For example, parallel-plate-to-waveguide transitions may be employed to transition from the diplexer 10 B-dimension (height h) to a convenient waveguide narrow wall B-dimension ($h_{wg}$) that is consistent with the diplexed frequency band of interest. FIG. 10 illustrates such a parallel-plate-to-waveguide transitions 34 included at the respective ports 16 and 18. Additional information concerning a waveguide-to-parallel-plate transition can be found in U.S. application Ser. No. 14/073,990, which is hereby incorporated by reference in its entirety. In another embodiment, the parallel-plate-to-waveguide transition 34 may include a 90-degree twist as desired. Other type transitions such as a parallel-plate-to-stripline, parallel-plate-to-microstrip, etc., also may be used in combination with the parallel-plate diplexer 10 as design needs dictate.

Figure 11:
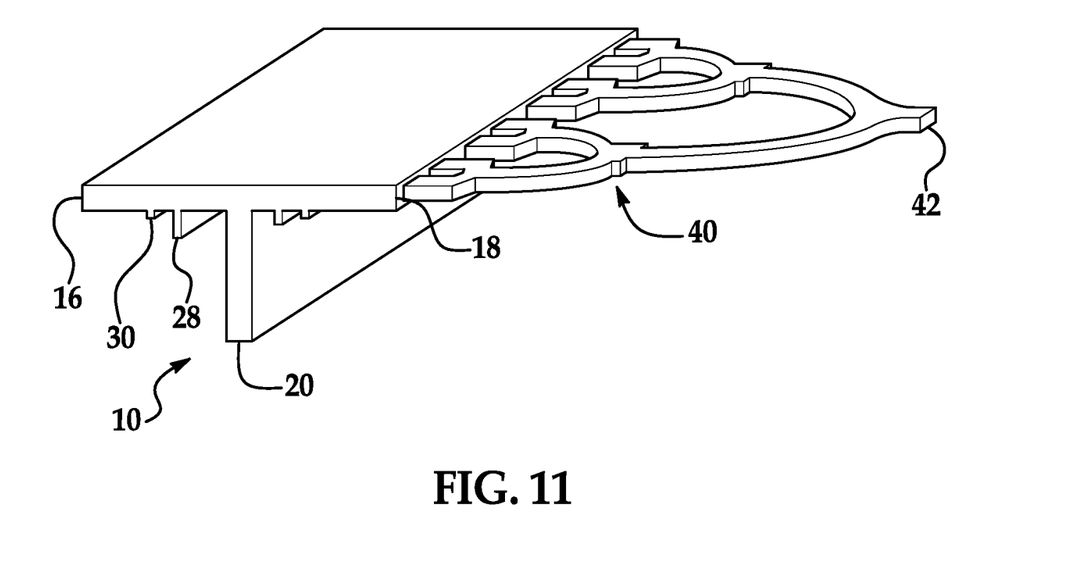
FIG. 11 is an isometric view of the parallel-plate diplexer shown in FIG. 2, further including an exemplary corporate waveguide feed at an output port.

FIG. 11 illustrates a parallel-plate-to-waveguide transition in the form of a waveguide corporate feed 40 coupled to the first port 16. Although not shown, a similar waveguide corporate feed 40 may be coupled to the second port 18 and/or third port 22. Each waveguide corporate feed 40 is comprised of a series of H-plane bends and Tee's that constructively combine the RF fields into a single waveguide port (e.g., 42). The two waveguide corporate feeds 40 (one dedicated to low-band operation and the second dedicated to high-band operation) each supporting the two separate frequency bands feeding the parallel-plate diplexer 10 from the opposite ports 16 and 18.

Figure 12:
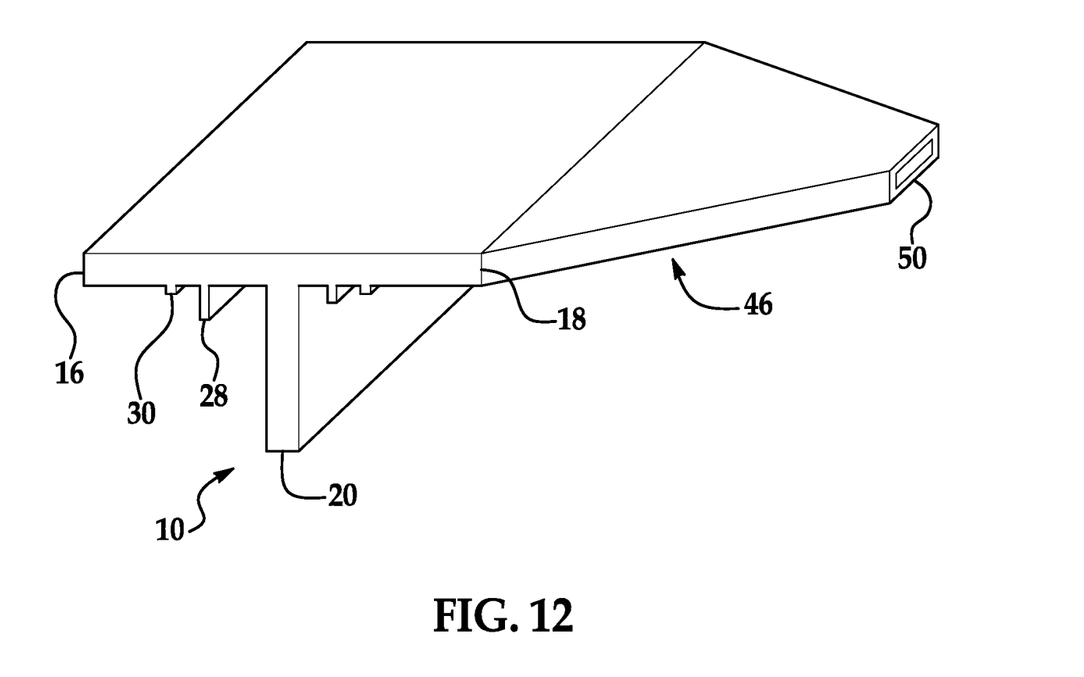
FIG. 12 is an isometric view of the parallel-plate diplexer shown in FIG. 2, further including an exemplary tapered horn feed at an output port.

FIG. 12 illustrates another embodiment of a parallel-plate-to-waveguide transition. In the case of FIG. 12, a tapered horn 46 is combined with the parallel-plate diplexer 10 at the port 16 to effect this transition from parallel-plate to a single waveguide output 50.

As will be appreciated, a variety of embodiments are possible utilizing any arbitrary feeding networks or combinations of arbitrary feeding networks to combine an arbitrary number of parallel-plate-to-waveguide transitions. One or more parallel-plate tuning networks (not shown) also may be included as desired to optimize the RF performance of the integrated diplexer/feeding network ensemble.

Figure 13A:
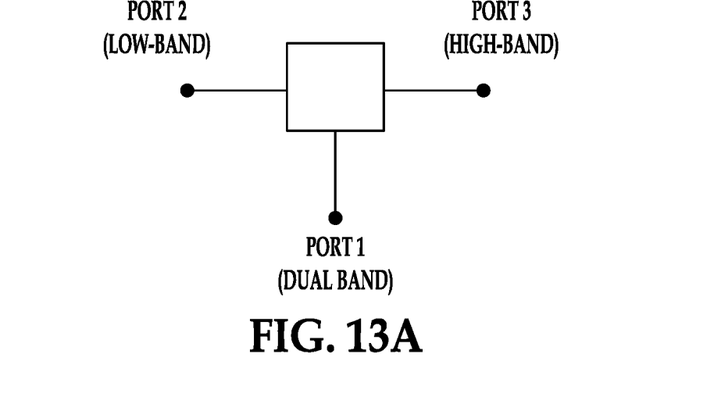
FIGS. 13A-13D are simulation plots illustrating port assignments (FIG. 13A); diplexer insertion loss performance (FIG. 13B); high-band higher-order mode isolation performance (FIG. 13C); and low-band higher-order mode isolation performance (FIG. 13D).

Referring now to FIGS. 13A-13D, illustrated are simulation results of the performance of the parallel-plate diplexer 10 according to the embodiment shown in FIG. 10. In this particular example, the diplexer 10 is designed to operate in a low-band of 20.2-21.2 GHz and a high-band of 43.5-45.5 GHz. FIG. 13A illustrates the port assignments, where port 1 represents the dual-band port (third port 20 described above); port 2 represents the low-band port (first port 16 described above); and port 3 represents the high-band port (second port 18 described above).

Figure 13B:
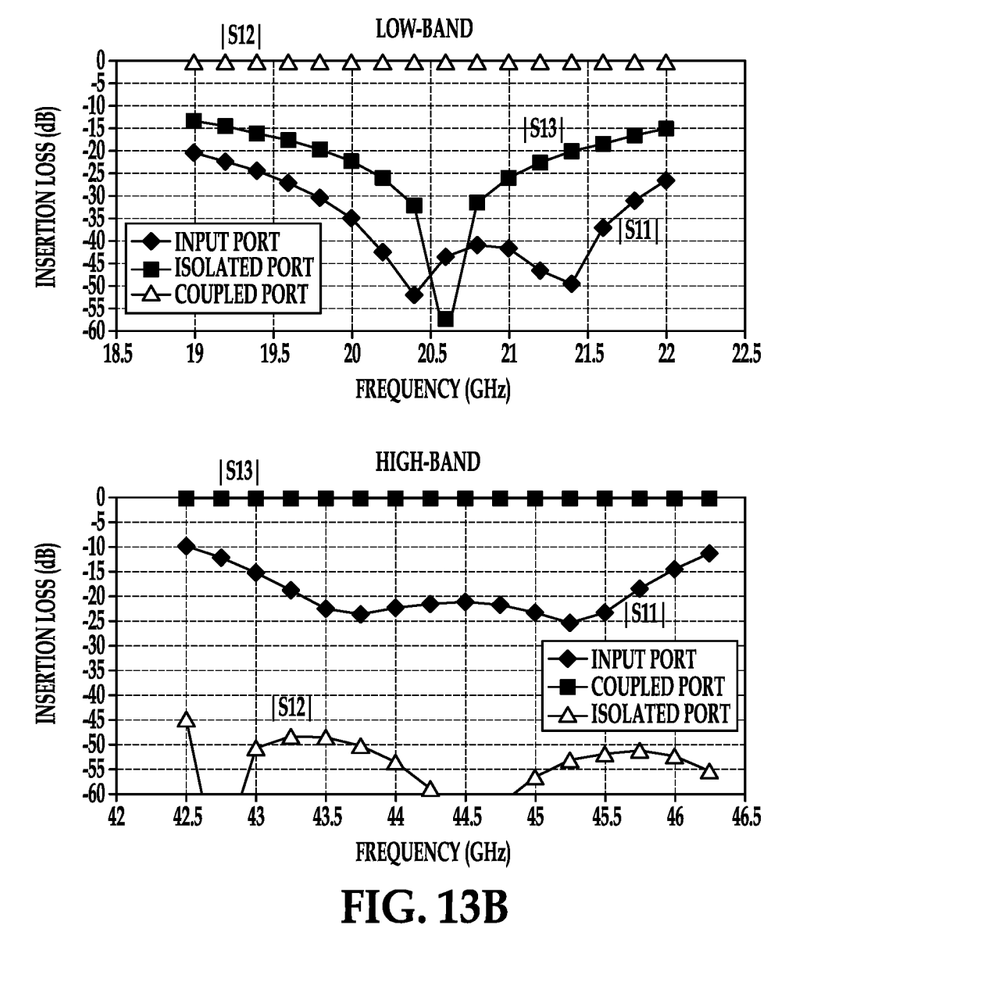

FIG. 13B illustrates the Low-Band and High-Band characteristics of a 20.7 GHz/44.5 GHz example detailing excellent input match (low return loss), low transmission loss, and high-isolation in each of the two operating bands.

Figure 13C:
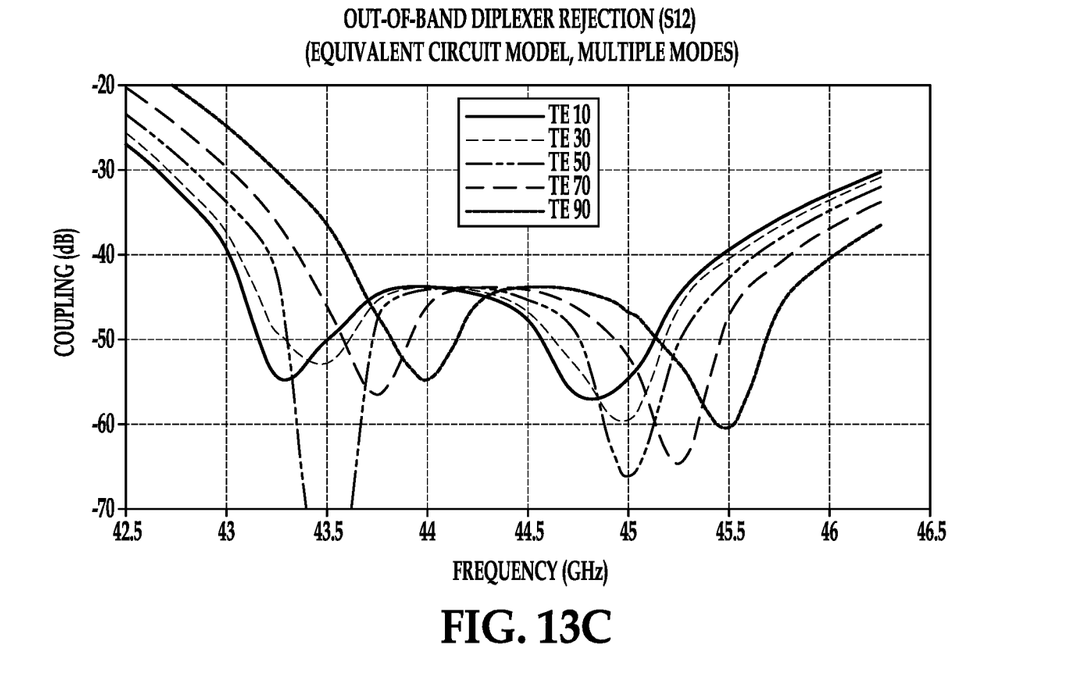
Figure 13D:
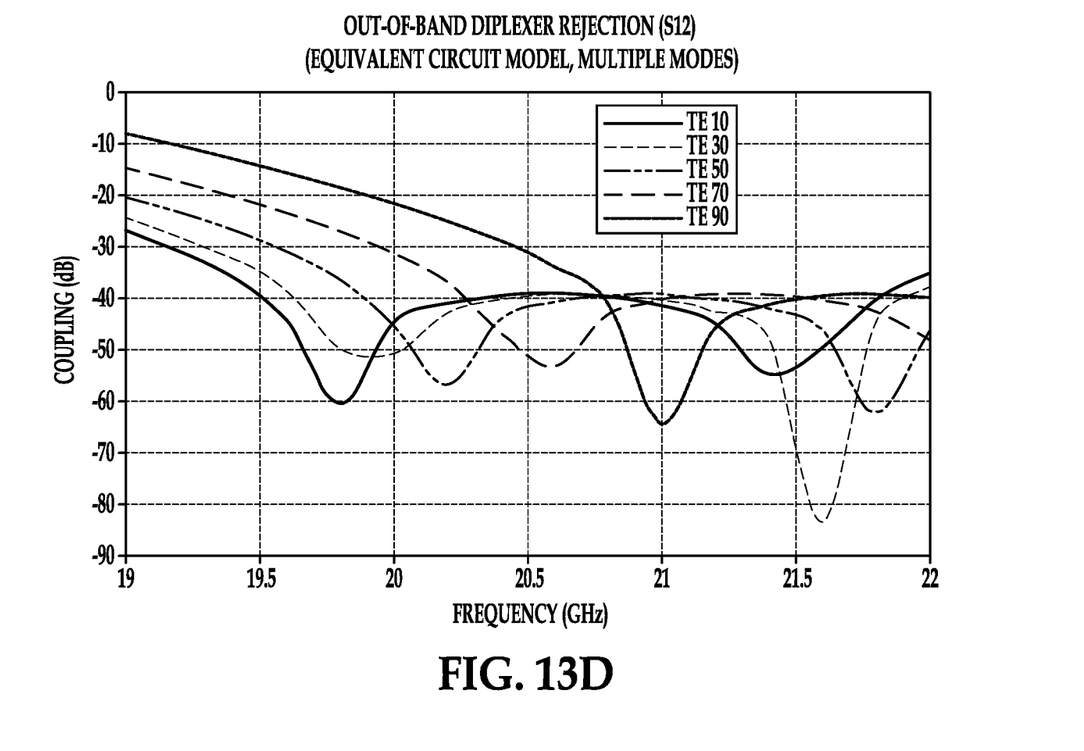

FIG. 13C shows the isolation characteristic in the isolated parallel-plate port, as computed for different modes (TE10, TE30, etc.) present in the parallel-plate structure. It is desirable to maintain excellent isolation (−40 dB or more) in the isolated band (43.5-45.5 GHz in this example) for all modes (or at least all modes containing significant energy). This is accomplished through analysis and design of the design details which includes depth and positional offset relative to the parallel-plate T-junction for the resonators and tuner grooves, including consideration and compensation for mode dispersion effects as discussed herein. FIG. 13D illustrates the same mode characteristics, in this case for the low-frequency band 20.2-21.2 GHz.

Figure 14:
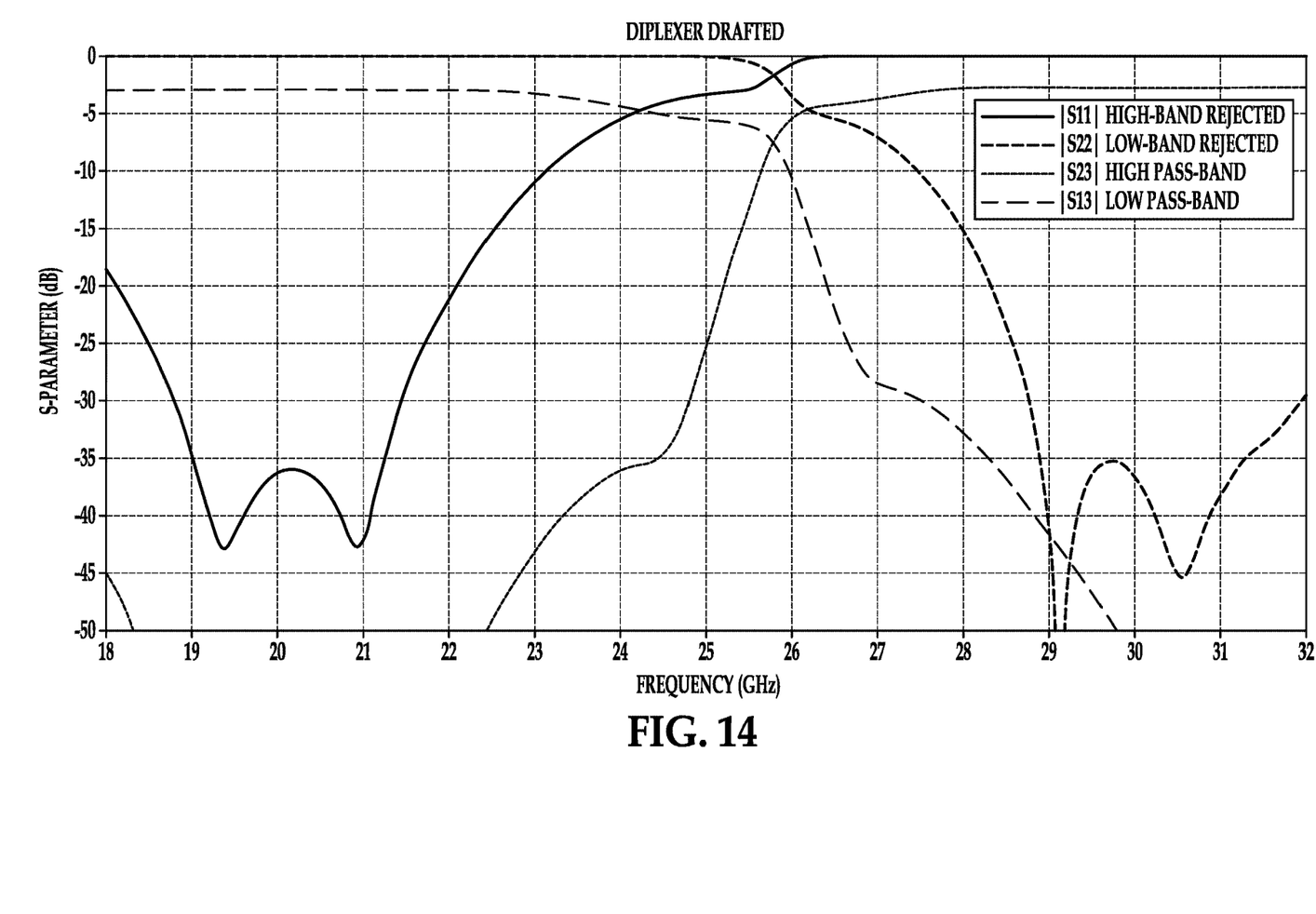
FIG. 14 is a simulation plot showing scattering parameter performance of a 20/30 GHz diplexer design.

FIG. 14 illustrates the diplexer scattering parameter performance of another embodiment operating in the 20 GHz and 30 GHz frequency bands with a different port numbering scheme relative to that shown in FIG. 1A, with port 1 representing the low-band port, port 2 representing the high-band port, and port 3 representing the dual-band port. Collectively, the scattering parameter performance results illustrate the diplexer 10's efficient separation of the two operating bands from one another.

The parallel-plate diplexer 10 described herein provides means for potential weight savings, space savings, and reduced design complexity. High-Q dispersion compensation within the parallel-plate diplexer 10 offers a means for separating (splitting) two frequency bands contained in a single parallel plate transmission line into two separate parallel-plates prior to transitioning to waveguide. Thereby, this: 1) allows a waveguide feed supporting each parallel plate to be designed to operate more efficiently over a narrower, albeit still relatively wide, frequency band, 2) allows the waveguide feed to be more easily manufactured using standard waveguide as opposed to ridged waveguide or other cost-prohibitive transmission line, and 3) eliminates the need for a separately attached, less-efficient diplexer in order to substantially reduce packaging size and cost.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

The invention claimed is:

1. A parallel-plate diplexer, comprising:
   a first parallel-plate transmission line; and
   a second parallel-plate transmission line,
   wherein a first end of the second parallel-plate transmission line includes a first port and a second end of the second parallel-plate transmission line includes a second port, and a first end of the first parallel-plate transmission line includes a third port and a second end of the first parallel-plate transmission line is coupled to the second parallel-plate transmission line at an E-plane T-junction between the first port and the second port,
   wherein the second parallel-plate transmission line includes a first parallel-plate transmission line multi-groove tuning network matched and integral with the E-plane T-junction and located between the E-plane T-junction and the first port, and a second parallel-plate transmission line multi-groove tuning network matched and integral with the E-plane T-junction and located between the E-plane T-junction and the second port.

2. The parallel-plate diplexer according to claim 1, wherein the first parallel-plate transmission line multi-groove tuning network is configured in order that the second parallel-plate transmission line between the first port and the E-plane T-junction passes radio-frequency (RF) energy in a low-band and rejects RF energy in a high-band which is separate from and higher than the low-band, the second parallel-plate transmission line multi-groove tuning network is configured in order that the second parallel-plate transmission line between the second port and the E-plane T-junction passes the RF energy in the high-band and rejects the RF energy in the low-band, and the first parallel-plate transmission line is configured in order to pass RF energy in both the low-band and the high-band.

3. The parallel-plate diplexer according to claim 2, wherein at least one of the first parallel-plate transmission line multi-groove tuning network or the second parallel-plate transmission line multi-groove tuning network includes one or more parallel-plate tuner grooves or resonators.

4. The parallel-plate diplexer according to claim 3, wherein each resonator includes at least two corresponding tuner grooves.

5. The parallel-plate diplexer according to claim 2, wherein the first parallel-plate transmission line multi-groove tuning network is configured to form substantially a short circuit with respect to the RF energy in the high-band, and the second parallel-plate transmission line multi-groove turning network is configured to form substantially a short circuit with respect to the RF energy in the low-band.

6. The parallel-plate diplexer according to claim 2, wherein the high-band and low-band have a bandwidth separation of at least 2:1.

7. The parallel-plate diplexer according to claim 6, wherein the low-band and high-band incorporate 20.7 Gigahertz (GHz) and 44.5 GHz, respectively.

8. The parallel-plate diplexer according to claim 1, wherein a parallel-plate tuning network is arranged on a surface of the second parallel-plate that is immediately adjacent a junction joining the second parallel-plate to the first parallel-plate.

9. The parallel-plate diplexer according to claim 1, wherein a parallel-plate tuning network is arranged on a surface of the second parallel-plate that is opposite a junction joining the second parallel-plate to the first parallel-plate.

10. The parallel-plate diplexer according to claim 1, wherein a height of the parallel-plate portion between the E-plane T-junction and the first port is different from a height of the parallel-plate portion between the E-plane T-junction and the second port.

11. The parallel-plate diplexer according to claim 1, wherein dimensions of the first parallel-plate transmission line and the second parallel-plate transmission line are configured to favor transmission of lower-order modes over higher-order modes.

12. The parallel-plate diplexer according to claim 1, wherein at least one of the first, second and third ports include a respective parallel plate-to-waveguide transition coupled thereto.

13. The parallel-plate diplexer according to claim 12, wherein at least one of the respective parallel plate-to-waveguide transitions couples to a corporate waveguide feed.

14. The parallel-plate diplexer according to claim 12, wherein at least one of the respective parallel plate-to-waveguide transitions couples to a tapered horn feed.

* * * * *